(12) United States Patent
Fukuda et al.

(10) Patent No.: US 6,222,400 B1
(45) Date of Patent: Apr. 24, 2001

(54) LOCK-IN DETECTING CIRCUIT HAVING VARIABLE WINDOW FOR CHECKING PHASE LOCKED LOOP AND METHOD USED THEREIN

(75) Inventors: Yasuhiro Fukuda; Takafumi Esaki; Yoshiyuki Uto; Hiroshi Furukawa, all of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/472,950

(22) Filed: Dec. 27, 1999

(30) Foreign Application Priority Data

Jan. 8, 1999 (JP) .................................................. 11-002981

(51) Int. Cl.⁷ ....................................................... H03L 7/00
(52) U.S. Cl. ........................................... 327/151; 327/147
(58) Field of Search ...................................... 327/147, 151, 327/156, 159, 160; 375/373, 376

(56) References Cited

U.S. PATENT DOCUMENTS 5,822,387 * 10/1998 Mar ....................................... 375/376
5,886,582 * 3/1999 Stansell ................................. 327/143

FOREIGN PATENT DOCUMENTS 3-222138    10/1991    (JP) .
5-327488    12/1993    (JP) .

* cited by examiner

Primary Examiner—Toan Tran
Assistant Examiner—Linh Nguyen
(74) Attorney, Agent, or Firm—McGinn & Gibb, PLLC (57) ABSTRACT

A phase locked loop makes a system clock signal synchronous to a horizontal synchronizing signal for a display unit, and a lock-in detecting circuit monitors said phase locked loop to see whether or not a phase difference takes place between the system clock signal and the horizontal synchronizing signal, wherein the lock-in detecting circuit measures the unlocked state between the system clock signal and the horizontal synchronizing signal in a window defined in a vertical synchronizing period and, thereafter, compares the time period of the unlocked state with a critical value to see whether or not the unlocked state is due to a temporary phenomenon or a phase difference to be corrected so that an detecting signal of the lock-in detecting circuit is reliable.

21 Claims, 5 Drawing Sheets

LOCK-IN DETECTING CIRCUIT HAVING VARIABLE WINDOW FOR CHECKING PHASE LOCKED LOOP AND METHOD USED THEREIN

FIELD OF THE INVENTION

This invention relates to a lock-in detecting circuit and a method used therein and, more particularly, to a lock-in detecting circuit for a phase-locked loop incorporated in a display unit responsive to different synchronous signals such as, for example, a multiscan display unit and a method used in the lock-in detecting circuit.

DESCRIPTION OF THE RELATED ART

The display unit which selectively responds to vertical synchronous signals different in period and horizontal synchronizing signals also different in period is hereinbelow referred to as "multi-synchronization display unit". In the multi-synchronization display unit, various kinds of signals are produced in synchronization with a horizontal synchronizing signal by controlling the deflection correcting. It is necessary for the control for the deflection correcting to synchronize the system clock with the horizontal synchronizing signal. A phase locked loop is used for the synchronization. If the system clock is out of the lock-in state, the various kinds of signals becomes uncontrollable. For this reason, the phase locked loop is associated with a lock-in detecting circuit, and the lock-in detecting circuit monitors the phase difference between the horizontal synchronizing signal and the system clock to see whether or not the phase locked loop keeps those signal in the lock-in state. The lock-in detecting circuit produces a detecting signal representative of the lock-in state or unlocked state, and the detecting signal is supplied to a controller for the deflection correcting.

Figure 1:
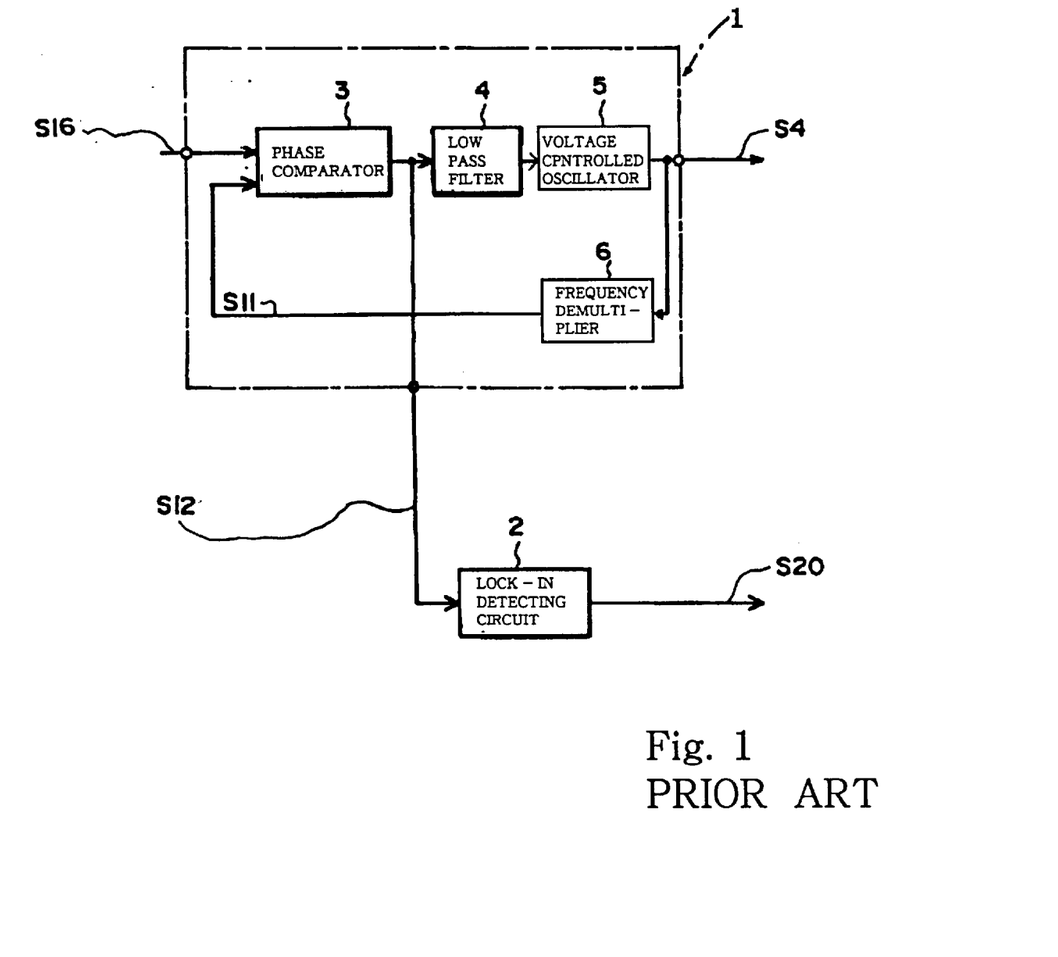
FIG. 1 is a block diagram showing the relation between the phase locked loop and the prior art lock-in detecting circuit.

FIG. 1 illustrates the relation between a phase locked loop 1 and the prior art lock-in deflecting circuit 2. The phase locked loop 1 comprises a phase comparator 3, a low pass filter 4 connected to the output node of the phase comparator 3, a voltage-controlled oscillator 5 connected to the output node of the low pass filter 4 and a frequency demultiplier 6 connected between the output node of the voltage controlled oscillator 5 and one of the input node of the phase comparator 3.

The frequency demultiplier 6 produces a low-frequency signal S11 from a system clock signal S44 and the low-frequency signal S11 has a frequency regulated to 1/n of the system clock S4. A horizontal synchronizing signal S16 is supplied to the other input node of the phase comparator 3, and the low-frequency signal S11 is supplied from the frequency demultiplier 6 to the input node of the phase comparator 3. The phase comparator 3 compares the low frequency signal S11 with the horizontal synchronizing signal S16 to see whether any phase difference takes place between the low frequency signal S11 and the horizontal synchronizing signal S16. The phase comparator 3 produces a phase difference signal S12 representative of the phase difference between the low-frequency signal and the horizontal synchronizing signal, and supplies the phase difference signal S12 to the low pass filter 4. The low pass filter 4 converts the phase difference signal S12 to a control voltage signal, and supplies the control voltage signal to the control node of the voltage controlled oscillator 5. The voltage controlled oscillator 5 is responsive to the control voltage signal so as to change or keep the frequency of the system clock signal S4.

The phase difference signal S12 is further supplied to the prior art lock-in detecting circuit 2. The prior art lock-in circuit 2 checks the phase difference signal S12 to see whether the system clock S4 and the horizontal synchronizing signal S16 are in the lock-in state or the unlocked state. The prior art lock-in detecting circuit 2 produces a detecting signal S20 representative of the lock-in state or the unlocked state.

Figure 2:
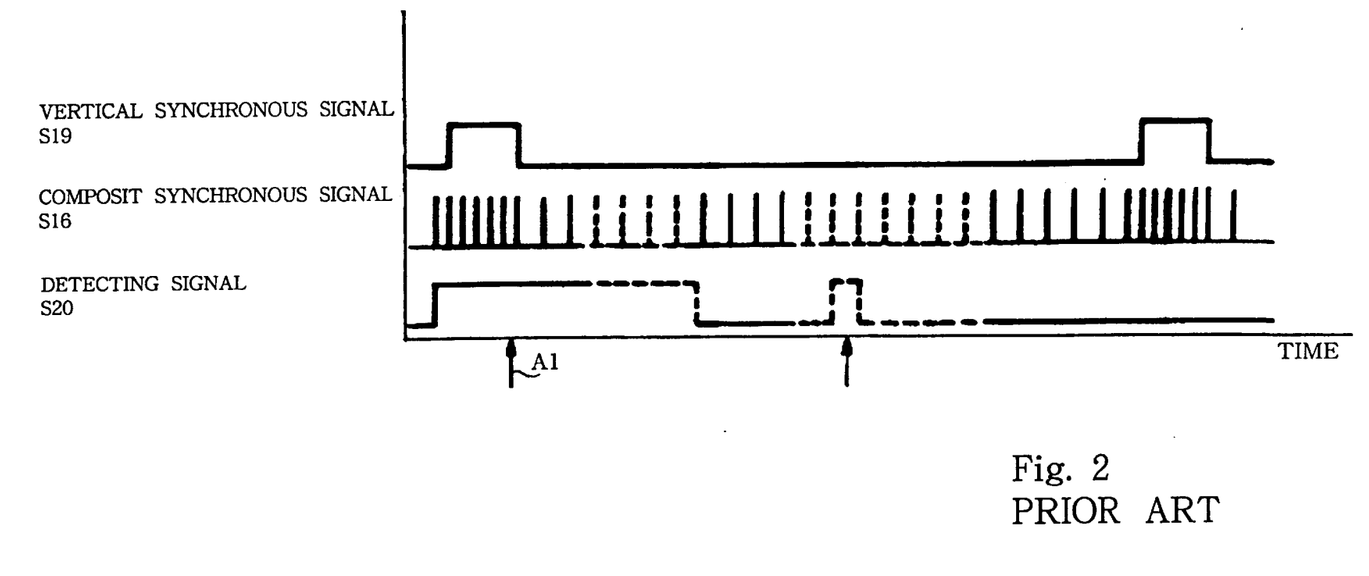
FIG. 2 is a timing chart showing the circuit behavior of the prior art locking detecting circuit.

FIG. 2 shows the circuit behavior of the prior art lock-in detecting circuit. A composite synchronous signal is supplied to the input node of the phase comparator 3 assigned to the horizontal synchronizing signal S16. While the vertical synchronous signal S19 is maintained at a high level, the horizontal synchronizing signal S16 is varied in frequency, and the system clock S4 is changed to the unlocked state. Accordingly, the prior art lock-in detecting circuit 2 changes the detecting signal S20 to the high level, and keeps the detecting signal S20 in the high level for a certain period as indicated by arrow A1. This results in a malfunction.

Even though the system clock S4 stays in the lock-in state, noise causes the phase locked loop 1 to momentarily enter the unlocked state. Even though the unlocked state continues only one clock pulse of the horizontal synchronizing signal S16, the prior art lock-in detecting circuit determines the phase locked loop to be in the unlocked state, and the malfunction takes place. In the worst case, the detection results in a system reset.

Plural signals are input to the multi-synchronization display unit, and the number of pulses of the horizontal synchronizing signal S16 between the vertical synchronous pulses is not always constant. In this situation, if the detecting time period of the phase locked loop is set to a certain constant value, the phase locked loop ignores the pulses of the horizontal synchronizing signal after the detecting period, and the phase locked loop is not expected to keep the system clock signal in the lock-in state.

Other examples of the detecting circuit of the type detecting the lock-in state on the basis of the phase difference are disclosed in Japanese Patent Publication of Unexamined Application Nos. 3-222138 and 5-327488. In detail, a phase controlling circuit is disclosed in Japanese Patent Publication of Unexamined Application No. 3-222138. The prior art phase controlling circuit firstly averages the amount of deviation between a signal to be controlled and a reference signal, and calculates the difference of the average from a standard value for the phase control. The prior art phase controlling circuit controls the phase of the signal. On the other hand, a phase synchronization circuit and a detecting circuit for detecting asynchronous state are disclosed in Japanese Patent Publication of Unexamined Application No. 5-327488. The prior art detecting circuit detects the asynchronous state through a phase comparison in the pulse width with respect to a reference clock signal.

Thus, the malfunction tends to take place in the system associated with the prior art lock-in detecting circuit, and another problem is a low discriminative capability between the asynchronous state and the other phenomena.

Although the other prior art circuits disclosed in the Japanese Patent Publication of Unexamined Applications discriminate the asynchronous state, they can not change the starting point for the detection, the detecting period and the sensitivity to appropriate values. For this reason, the prior art circuits can not establish the multi-synchronization display unit in the highly synchronous state, not exactly generate the detecting signal representative of the unlocked state.

SUMMARY OF THE INVENTION

It is therefore an important object of the present invention to provide a lock-in detecting circuit, which has a variable starting point for the detection, a variable detecting time and a variable sensitivity for producing a detecting signal exactly representing lock-in state.

It is another an important object of the present invention to provide a method for exactly detecting lock-in state.

In accordance with one aspect of the present invention, there is provided a lock-in detecting circuit associated with a phase locked loop operative to make an output signal synchronous with a first synchronizing signal, and the lock-in detecting circuit comprises a window generating means for defining a window to be opened for a first time period, a measuring means connected to the phase locked loop and the window generating means for measuring a second time period of unlocked state between the output signal and the first synchronizing signal while the window is being opened and a judging means connected to the measuring means and comparing the second time period with a critical time period to see whether the unlocked state is due to a temporary phenomenon or a phase difference to be corrected for producing a detecting signal representative of the phase difference to be corrected.

In accordance with another aspect of the present invention, there is provided a method for detecting unlocked state between a first synchronizing signal supplied to a phase locked loop and an output signal output from the phase locked loop, and the method comprises the steps of a) determining a critical time period for providing a criteria between a temporary phenomenon and a phase difference to be corrected and a first time period for making a window open, b) measuring the first time period from a starting point after an activation of a second synchronizing signal so as to make a window open over the second time period, c) measuring a second time period when the first synchronizing signal and the output signal are in unlocked state during the window is opened, d) comparing the second time period with the critical time period to see whether or not the unlocked state is due to the temporary phenomenon or the phase difference to be corrected e) producing a detecting signal representative of one of the unlocked state and a lock-in state and f) repeating the steps c), d) and e).

BRIEF DESCRIPTION OF THE DRAWINGS

The features and advantages of the lock-in detecting circuit and the method will be more clearly understood from the following description taken in conjunction with the accompanying drawings in which.

DESCRIPTION OF THE PREFERRED EMBODIMENTS

First Embodiment

Figure 3:
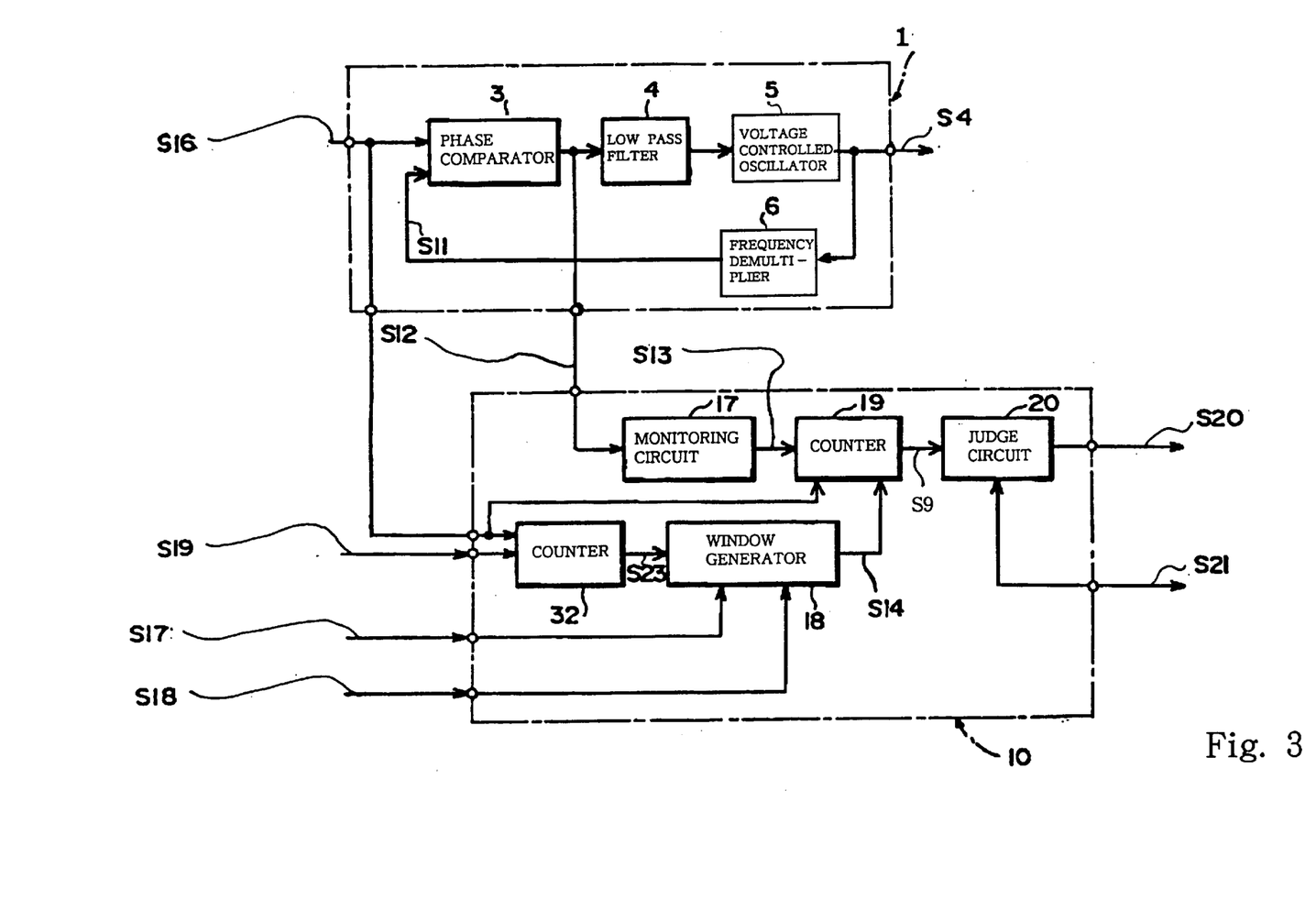
FIG. 3 is a block diagram showing a lock-in detecting circuit according to the present invention.

Referring to FIG. 3 of the drawings, a lock-in detecting circuit 10 embodying the present invention monitors a phase locked loop 1 to see whether or not a system clock signal S4 is synchronous with a horizontal synchronizing signal S16. The phase locked loop 1 is similar to that of the prior art shown in FIG. 1, and the components, i.e., a phase comparator, a low pass filter, a voltage controlled oscillator and a frequency demultiplier are labeled with references same as those designating the corresponding components of the prior art circuit. The frequency demultiplier 6 produces a low-frequency signal S11 from the system clock signal S4, and the low-frequency signal S11 has a frequency regulated to 1/n of the system clock S4. A horizontal synchronizing signal S16 is supplied to an input node of the phase comparator 3, and the low-frequency signal S11 is supplied from the frequency demultiplier 6 to the other input node of the phase comparator 3. The phase comparator 3 compares the low frequency signal S11 with the horizontal synchronizing signal S16 to see whether any phase difference takes place between the low frequency signal S11 and the horizontal synchronizing signal S16. The phase comparator 3 produces a phase difference signal S12 representative of the phase difference between the low-frequency signal S11 and the horizontal synchronizing signal S16, and supplies the phase difference signal S12 to the low pass filter 4 and the lock-in detecting circuit 10. The low pass filter 4 converts the phase difference signal S12 to a control voltage signal, and supplies the control voltage signal to the control node of the voltage controlled oscillator 5. The voltage controlled oscillator 5 is responsive to the control voltage signal so as to change or keep the frequency of the system clock signal S4.

The lock-in detecting circuit 10 checks the phase difference signal S12 to see whether or not the system clock S4 is in lock-in state with the horizontal synchronizing signal S16, and produces a detecting signal S20 representative of the relation between the horizontal synchronizing signal S16 and the system clock signal S4. The lock-in detecting circuit 10 comprises a monitoring circuit 17, a counter 19, a judge circuit 20, a counter 32 and a window generator 18. These components 17/18/19/20/32 behaves as follows.

While the phase locked loop 1 is synchronizing the system clock signal S4 with the horizontal synchronizing signal S16, the monitoring circuit 17 monitors the phase difference signal S12, and checks the phase difference signal S12 to see whether or not the phase locked loop 1 establishes the system clock signal S4 in the lock-in state or the synchronized state with the horizontal synchronizing signal S16. While the low-frequency signal S11 and, accordingly, the system clock signal S4 are different in phase from the horizontal synchronizing signal S16, the phase difference signal S12 is maintained at a high level. The time period at the high level is representative of the amount of phase difference between the system clock signal S4 and the horizontal synchronizing signal S16. The monitoring circuit 17 measures a time period while the phase comparator 3 is maintaining the phase difference signal S12 at the high level. If the time period is shorter than a maximum time period to be allowed from the viewpoint of the system behavior, the monitoring circuit 17 keeps a detecting signal S13 in the low level. On the other hand, when the time period is longer than the maximum time period, the monitoring circuit 17 decides the system clock signal S4 to be out of the lock-in state or asynchronous with the horizontal synchronizing signal S16, and the monitoring circuit 17 produces the detecting signal S13 to the high level representative of the unlocked state. The monitoring circuit 17 supplies the detecting signal S13 of the high level to the counter 19 as an enable signal.

A vertical synchronizing signal S19 and the horizontal synchronizing signal S16 are supplied to the counter 32. The synchronizing pulse of the vertical synchronizing signal S19 resets the counter 32 to an initial value. While the vertical synchronizing signal S19 is staying in the low level, the counter 32 is enabled. The counter 32 increments the stored value in response to each synchronizing pulse of the horizontal synchronizing signal S16. Thus, the counter 32 counts the horizontal synchronizing pulses between two vertical synchronizing pulses. The counter 32 produces an output signal S23 representative of the stored value, and supplies the output signal S23 to the window generator 18.

An external control signal S17 with value m and another external control signal S18 with value n are supplied to the window generator 18. The value m is representative of the number of pulses to be counted by the counter 32 until a starting point of a counting operation carried out by the counter 19, and the value n is representative of the number of pulses or a time period after the starting point for continuing the counting operation.

The window generator 18 defines a window on the basis of the external control signals S17/S18. Namely, the window generator 18 opens a window at the starting point, and keeps the window open over the time period. In detail, the window generator 18 compares the value of the output signal S23 with the value m and with the value n. When the output signal S23 reaches the value m, the window generator changes a control signal S14 representative of the window to the high level. The control signal S14 is supplied to the counter 19. The window generator 18 keeps the control signal S14 in the high level until the output signal S23 reaches the total value (m+n). When the output signal S23 reaches the total value (m+n), the window generator 18 closes the window, and changes the control signal S14 to the low level.

The external control signals S17/S18 may be changed depending upon the horizontal synchronizing signal S16 and the vertical synchronizing signal S19 by using a personal computer (not shown). On the other hand, the starting point and the time period may be fixed to appropriate values and stored in the window generator 18.

The horizontal synchronizing signal S16, the detecting signal S13 and the control signal S14 are supplied to the counter 19. While the counter 19 is being enabled with the detecting signal S13, the control signal S14 defines the window in the counter 19, and the counter 19 counts the pulses of the horizontal synchronizing signal S16 in the window. The counter 19 produces an output signal S9 representative of the stored value, and supplies the output signal S9 to the judge circuit 20. When the control signal S14 is changed to the low level or the window is closed, the counter 19 is reset to zero.

The output signal S9 and another external control signal S21 are supplied to the judge circuit 20. The external control signal S21 is representative of a sensitivity of the lock-in detecting circuit 10. The external control signal S21 has a critical value between the lock-in state and the unlocked state. The judge circuit 20 compares the value of the output signal S9 with the critical value. Even it the counter 19 counts the pulses of the horizontal synchronizing signal S16, the counted pulses arc less than the critical value, the judge circuit 20 does not change the detecting signal S20 to the high level. Thus, the judge circuit 20 can ignore the phase difference due to the noise, and exactly discriminate the unlocked state of the system clock signal S4. The value of the external control signal S21 may be also changed depending upon the horizontal synchronizing signal S16 and the vertical synchronizing signal S19 by using the personal computer.

Figure 4:
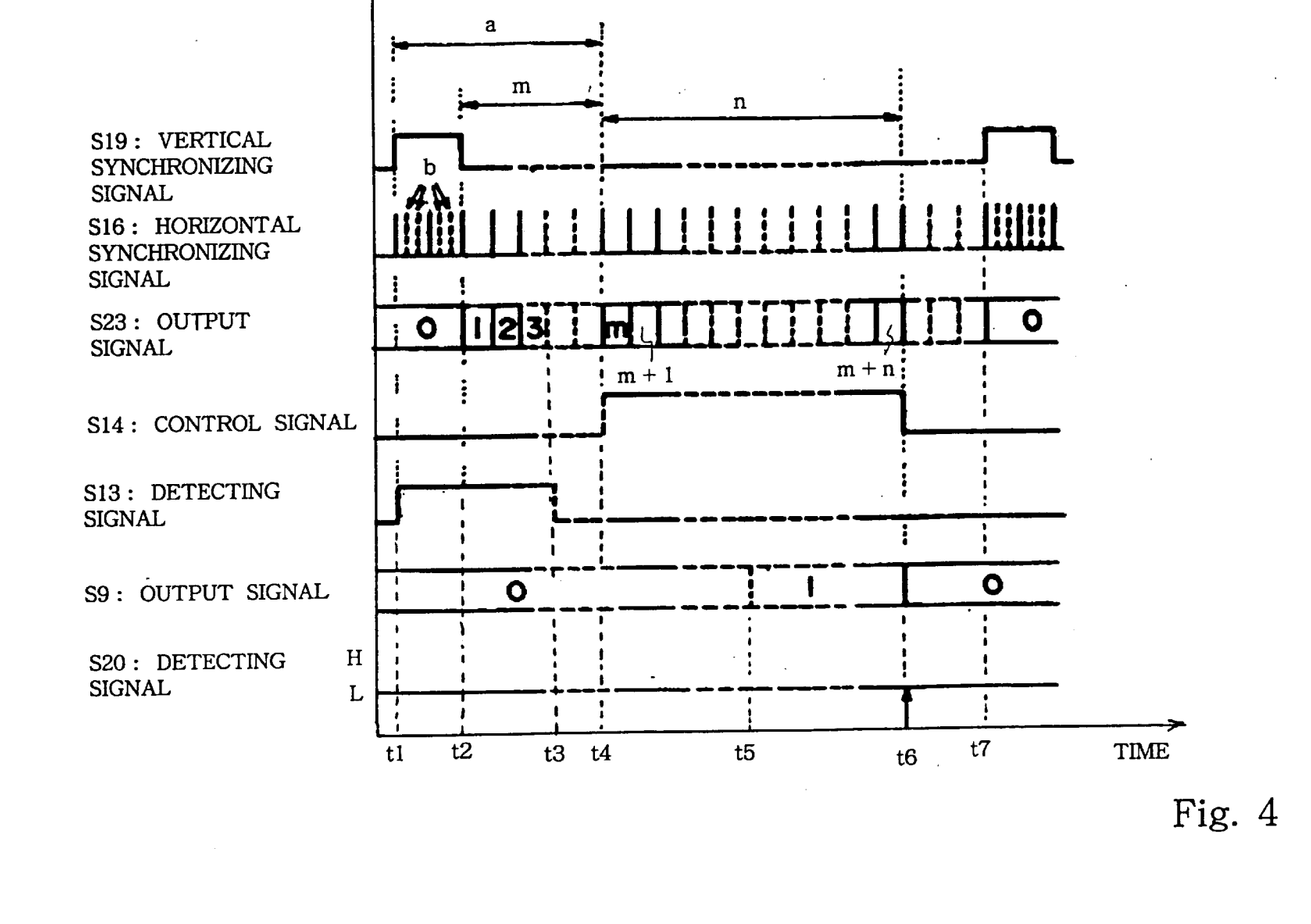
FIG. 4 is a timing chart showing essential signals of the lock-in detecting circuit.

FIG. 4 illustrates the behavior of the lock-in circuit 10. A composite synchronous signal is supplied to the phase comparator 3 and the counter 32 as the horizontal synchronizing signal S16. In the following description, the composite synchronizing signal is labeled with "S16". The vertical synchronizing signal S19 is staying in the high level from time t1 to time t2, and the composite synchronizing signal S16 changes the frequency thereof between time t1 and time t2. As a result, the phase locked loop 1 enters the unlocked state, and the phase difference signal S12 exceeds the maximum time period. Then, the monitoring circuit 17 changes the detecting signal S13 to the high level representative of the unlocked state. However, the window generator 18 keeps the control signal S14 low, and the counter 19 does not increment the stored value. As a result, the judge circuit 20 keeps the detecting signal S20 low. Although the prior art lock-in detecting circuit changes the detecting signal S20 to the high level due to the unlocked state of the phase locked loop during the change of the frequency, the lock-in detecting circuit 10 according to the present invention does not change the detecting signal S20, and prevents the system from the malfunction. When the vertical synchronizing signal S19 is recovered to the low level, the counter 32 starts to increment the stored value.

The phase locked loop 1 varies the frequency of the system clock signal S4, and makes the system clock signal S4 synchronous with the composite synchronizing signal S16. The phase comparator 3 changes the phase difference signal S12 to the low level, and, accordingly, the monitoring circuit 17 recovers the detecting signal S13 to the low level at time t3.

The counter 32 reaches value m at time t4, and the window generator 18 changes the control signal S14 to the high level at time t4. Then, the window is open. However, the detecting signal S13 has been already recovered to the low level, and the counter 19 keeps the stored value zero.

The counter 32 is incrementing the stored value, and reaches value (m+n) at time t5. Though not shown in FIG. 4, while the counter 32 is incrementing the stored value, the phase locked loop 1 enters the unlocked state due to noise in a time period equal to a single pulse of the vertical synchronizing signal S16, and the monitoring circuit 17 changes the detecting signal S13 to the high level. The window generator 18 has already opened the window, and the counter 19 increments the stored value to "1". The output signal S9 represents the stored value "1" at time t5. The external control signal S21 is assumed to set the sensitivity of the judge circuit 20 to "2". The stored value represented by the output signal S9 is less than the sensitivity of "2", and the judge circuit 20 does not change the detecting signal S20 to the high level. Thus, the lock-in detecting circuit 10 discriminates the temporary unlocked state due to the noise, and prevents the system from the malfunction.

The counter 32 reaches value (m+n) at time t6, and the window generator 18 changes the control signal S14 to the low level. Then, the window is closed, and the counter 19 is reset to zero. The vertical synchronizing signal S19 is changed to the high level at time t7, and the lock-in detecting circuit 10 repeats the above- described function. The multi-synchronization display unit is supplied with plural signals, and the pulses of the horizontal synchronizing signal S16 is not always constant between two pulses of the vertical synchronizing signal S19. If the number of pulses between the two pulses is fixed to a certain value, the lock-in detecting circuit ignores the phase difference signal after the certain value, and the lock-in detecting circuit is less reliable. On the contrary, the counter 32 and the window generator 18 permit an external control unit such as, for example, the personal computer to vary the window depending upon the horizontal synchronizing signal S16. It is possible to open the window immediately after the recovery of the detecting signal S13 to the low level and close it immediately before the next pulse rise of the vertical synchronizing signal S19. Thus, the variable window enhances the reliability of the lock-in detecting circuit 10.

In the first embodiment, the counter 32 and the window generator 18 as a whole constitute a window generating means, and the monitoring circuit 17 and the counter 19 form in combination a measuring means. The judge circuit 20 serves as a judging means. The horizontal/composite synchronizing signal S16 and the system clock signal S4 are corresponding to a first synchronizing signal and an output signal. Although the output signals S23/S9 represent the values stored in the counters 32/19, the values are representative of time periods, because the horizontal synchronizing signal is a kind of periodic signal.

Second Embodiment

Figure 5:
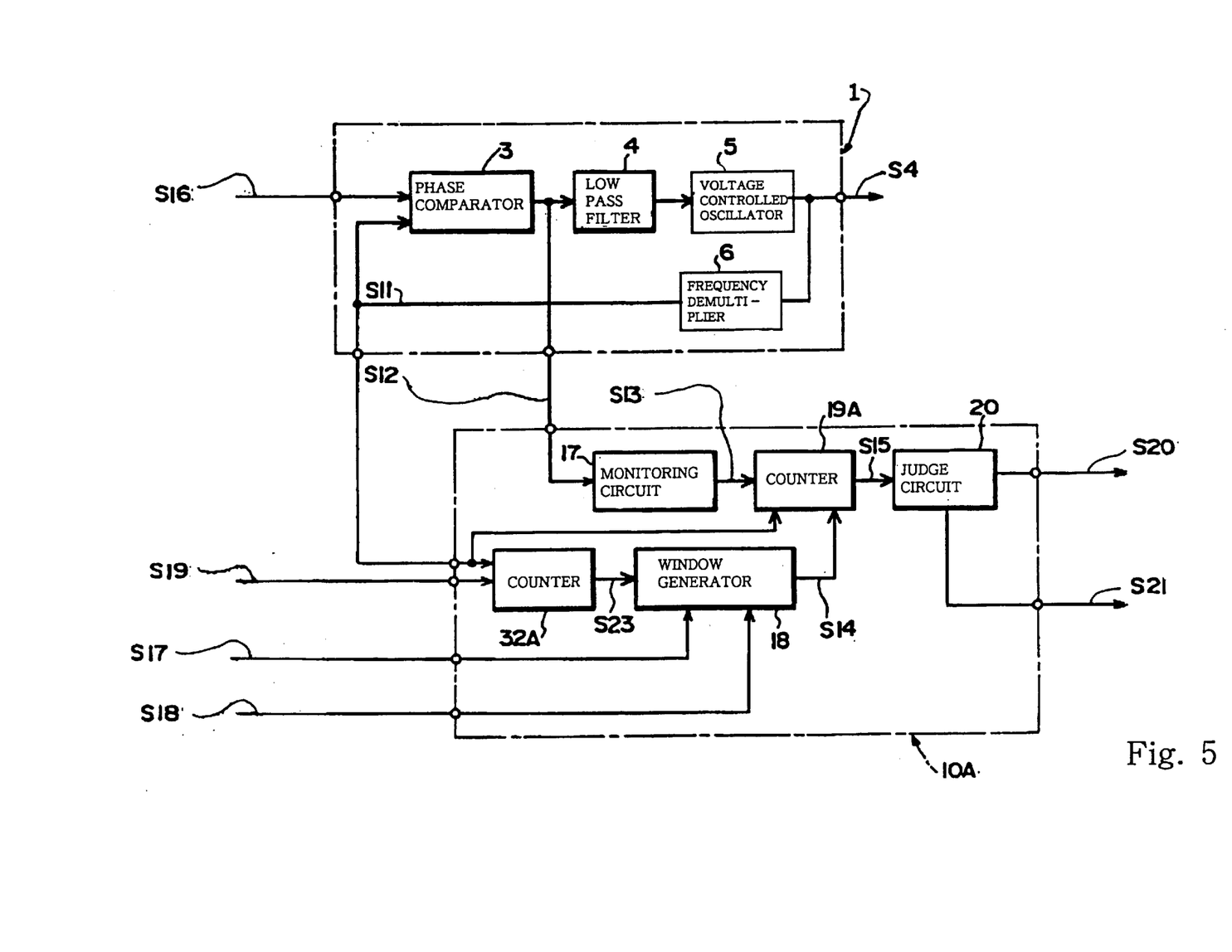
FIG. 5 is a timing chart showing another lock-in detecting circuit according to the present invention.

Turning to FIG. 5 of the drawings, another lock-in detecting circuit 10A embodying the present invention is associated with the phase locked loop 1. The lock-in detecting circuit 10A implementing the second embodiment is similar to the lock-in detecting circuit 10 except for the low-frequency signal S11 supplied to counters 19A and 32A. For this reason, components of the phase locked loop 1 and other components of the lock-in detecting circuit 10A are labeled with the same references designating the corresponding components of the lock-in detecting circuit 10 without detailed description. The lock-in detecting circuit 10A is different in behavior from the lock-in detecting circuit under the condition where the horizontal synchronizing signal S16 is maintained in the low level. The lock-in detecting circuit 10 implementing the first embodiment keeps the detecting signal S20 low after the entry into the low level, because the counters 32/19 do not increment the stored values. Although the system clock signal S4 is unlocked, the lock-in detecting circuit 10 continuously outputs the detecting signal S20 of the low level representing the lock-in state.

On the other hand, the lock-in detecting circuit 10A can produce the detecting circuit S20 exactly representing the unlocked state. As described hereinbefore, the low frequency signal S11 is supplied to the counters 19A and 32A, and the counters 19A and 32A increment the stored values regardless of the horizontal synchronizing signal S16. Even if the horizontal synchronizing signal S16 is maintained in the low level, the counter 32A causes the window generator 18 to open the window, and the counter 19A increments the stored value. For this reason, the counter 19A exceeds the critical value set in the judge circuit 20, and the judge circuit 20 changes the detecting signal S20 to the high level representing the unlocked state.

Thus, the lock-in detecting circuits according to the present invention exactly discriminate the true unlocked state from temporary unlocked state due to the change in frequency or the noise, and are appropriate to the multi-synchronization display unit to which plural vertical synchronizing signals different in frequency and plural horizontal synchronizing signals different in frequency are supplied.

The lock-in detecting circuit implementing the second embodiment is equipped with the counters 19A/32A incrementing the stored values with the low frequency signal, and exactly discriminates the unlocked state due to the removal of the horizontal synchronizing signal.

Although particular embodiments of the present invention have been shown and described, it will be apparent to those skilled in the art that various changes and modifications may be made without departing from the spirit and scope of the present invention. For example, the judge circuit 20 may change the frequency of the detecting signal between the lock-in state and the unlocked state.

What is claimed is:

1. A lock-in detecting circuit associated with a phase locked loop operative to make an output signal synchronous with a first synchronizing signal, comprising:
   a window generating means for defining a window to be opened for a first time period;
   a measuring means connected to said phase locked loop and said window generating means for measuring a second time period of unlocked state between said output signal and said first synchronizing signal while said window is being opened; and
   a judging means connected to said measuring means, and comparing said second time period with a critical time period to see whether said unlocked state is due to a temporary phenomenon or a phase difference to be corrected for producing a detecting signal representative of said phase difference to be corrected.

2. The lock-in detecting circuit as set forth in claim 1, in which said first synchronizing signal and said output signal are a horizontal synchronizing signal supplied to a display unit together with a vertical synchronizing signal and a system clock signal, respectively.

3. The lock-in detecting circuit as set forth in claim 2, in which an external control signal respectively adjusts said first time period and said critical time period to values appropriate to said horizontal synchronizing signal and said vertical synchronizing signal.

4. The lock-in detecting circuit as set forth in claim 3, in which said external control signal changes said first time period and said critical time period depending upon said horizontal synchronizing signal and said vertical synchronizing signal both to be supplied to said display unit.

5. The lock-in detecting circuit as set forth in claim 1, in which said window generating means includes
   a counter reset to an initial value with a second synchronizing signal and incrementing stored value in response to said first synchronizing signal for producing an output signal representative of said stored value and
   a window generator connected to said counter and producing a control signal in order to make said window open in said first time period measured from a first value represented by said output signal of said counter to a second value represented by said output signal of said counter.

6. The lock-in detecting circuit as set forth in claim 1, in which said measuring means includes
   a monitoring circuit responsive to a detecting signal representative of said unlocked state so as to change an enable signal to an active level and
   a counter connected to said monitoring circuit and said window generating means, enabled with said enable signal so as to increment a stored value thereof during said window in response to said first synchronizing signal and producing an output signal representative of said second time period proportional to said stored value.

7. The lock-in detecting circuit as set forth in claim 1, in which said window generating means includes
   a first counter reset to an initial value with a second synchronizing signal and incrementing stored value in response to said first synchronizing signal for producing an output signal representative of said stored value and
   a window generator connected to said first counter and producing a control signal in order to make said window open in said first time period measured from a first value represented by said output signal of said first counter to a second value represented by said output signal of said first counter, and said measuring means includes
   a monitoring circuit responsive to a detecting signal representative of said unlocked state so as to change an enable signal to an active level and
   a second counter connected to said monitoring circuit and said window generator, enabled with said enable signal and said control signal so as to increment a stored value thereof in response to said first synchronizing signal and producing an output signal representative of said second time period proportional to said stored value.

8. The lock-in detecting circuit as set forth in claim 7, in which said first synchronizing signal and said second synchronizing signal are a horizontal synchronizing signal and a vertical synchronizing signal both supplied to a display unit.

9. The lock-in detecting circuit as set forth in claim 8, in which an external control signal respectively adjusts said first time period and said critical time period to values appropriate to said horizontal synchronizing signal and said vertical synchronizing signal.

10. The lock-in detecting circuit as set forth in claim 9, in which said external control signal changes said first time period and said critical time period depending upon said horizontal synchronizing signal and said vertical synchronizing signal both to be supplied to said display unit.

11. The lock-in detecting circuit as set forth in claim 1, in which said window generating means includes a counter reset to an initial value with a second synchronizing signal and incrementing stored value in response to a periodic signal proportionally produced from said output signal for producing an output signal representative of said stored value and a window generator connected to said counter and producing a control signal in order to make said window open in said first time period measured from a first value represented by said output signal of said counter to a second value represented by said output signal of said counter.

12. The lock-in detecting circuit as set forth in claim 1, in which said measuring means includes a monitoring circuit responsive to a detecting signal representative of said unlocked state so as to change an enable signal to an active level and a counter connected to said monitoring circuit and said window generating means, enabled with said enable signal so as to increment a stored value thereof during said window in response to a periodic signal proportionally produced from said output signal and producing an output signal representative of said second time period proportional to said stored value.

13. The lock-in detecting circuit as set forth in claim 1, in which said window generating means includes a first counter reset to an initial value with a second synchronizing signal and incrementing stored value in response to a periodic signal proportionally produced from said output signal for producing an output signal representative of said stored value and a window generator connected to said first counter and producing a control signal in order to make said window open in said first time period measured from a first value represented by said output signal of said first counter to a second value represented by said output signal of said first counter, and said measuring, means includes a monitoring circuit responsive to a detecting signal representative of said unlocked state so as to change an enable signal to an active level and a second counter connected to said monitoring circuit and said window generator, enabled with said enable signal and said control signal so as to increment a stored value thereof in response to said periodic signal and producing an output signal representative of said second time period proportional to said stored value.

14. The lock-in detecting circuit as set forth in claim 13, in which said first synchronizing signal and said second synchronizing signal are a horizontal synchronizing signal and a vertical synchronizing signal both supplied to a display unit.

15. The lock-in detecting circuit as set forth in claim 14, in which an external control signal respectively adjusts said first time period and said critical time period to values appropriate to said horizontal synchronizing signal and said vertical synchronizing signal.

16. The lock-in detecting circuit as set forth in claim 15, in which said external control signal changes said first time period and said critical time period depending upon said horizontal synchronizing signal and said vertical synchronizing signal both to be supplied to said display unit.

17. A method for detecting unlocked state between a first synchronizing signal supplied to a phase locked loop and an output signal output from said phase locked loop, comprising the steps of:

a) determining a critical time period for providing a criteria between a temporary phenomenon and a phase difference to be corrected and a first time period for making a window open;

b) measuring said first time period from a starting point after an activation of a second synchronizing signal so as to make a window open over said second time period;

c) measuring a second time period when said first synchronizing signal and said output signal are in unlocked state during said window is opened;

d) comparing said second time period with said critical time period to see whether or not said unlocked state is due to said temporary phenomenon or said phase difference to be corrected;

e) producing a detecting signal representative of one of said unlocked state and a lock-in state; and f) repeating said steps c), d) and e).

18. The method as set forth in claim 17, in which an external control signal respectively adjusts said critical time period and said first time period to values appropriate to said first synchronizing signal and said second synchronizing signal in said step a).

19. The method as set forth in claim 18, in which said external signal changes said values in said step f) depending upon said first synchronizing signal and said second synchronizing signal both to be supplied to a display unit.

20. The method as set forth in claim 17, in which said first time period is changed to an initial value at each activation of said second synchronizing signal in said step b), and said second time period is changed to an initial value when said first time period is expired in said step c).

21. The method as set forth in claim 20, in which said step f) is continued even if said first synchronizing signal is fixed to an inactive level.

* * * * *